United States Patent [19]

Fisher et al.

[11] 4,290,007
[45] Sep. 15, 1981

[54] HIGH POWER AND HIGH VOLTAGE TRANSISTOR CONTROL CIRCUIT

[75] Inventors: Bernard Fisher, Dayton; Robert C. Storar, Xenia, both of Ohio

[73] Assignee: United Systems Corporation, Dayton, Ohio

[21] Appl. No.: 99,378

[22] Filed: Dec. 3, 1979

[51] Int. Cl.³ .............................................. G05F 1/44
[52] U.S. Cl. .................................... 323/270; 323/269; 323/277; 323/906; 320/17
[58] Field of Search .................... 323/1, 4, 15, 23, 26, 323/31; 320/17-18, 39-40, DIG. 1; 307/43, 51, 54, 60, 61, 77

[56] References Cited

U.S. PATENT DOCUMENTS

| | | | |
|---|---|---|---|
| 3,041,501 | 6/1962 | Willits | 315/205 |
| 3,496,450 | 2/1970 | Thiele | 323/15 |
| 3,549,983 | 12/1970 | Sprogis | 323/15 |
| 3,600,599 | 8/1971 | Wright et al. | 323/15 |
| 3,955,132 | 5/1976 | Greenwood | 323/15 |
| 4,124,886 | 11/1978 | Black et al. | 307/77 |

FOREIGN PATENT DOCUMENTS 2261624 6/1974 Fed. Rep. of Germany ........ 323/23

Primary Examiner—William M. Shoop
Assistant Examiner—Peter S. Wong
Attorney, Agent, or Firm—Biebel, French & Nauman

[57] ABSTRACT

A transistorized circuit is used for controlling the flow of current through a high voltage source, such as a battery. The high voltage source must be capable of being tapped at voltages less than the critical voltage of the transistors in the circuit, that is, that voltage at the maximum current through the transistor, above which the breakdown characteristics or maximum power dissipation ability of the transistor is exceeded. A plurality of transistor arrays are connected in series with each other, and each array is connected to a tap on the voltage source. Each array includes parallel connected transistors in sufficient quantity to achieve the desired current flow. The current through each array is made equal by control circuits so that no current flows through the tapped connection to the voltage source. The transistorized circuit may be used to control both the charging and the discharging rate of current through a high voltage battery.

4 Claims, 5 Drawing Figures

...

HIGH POWER AND HIGH VOLTAGE TRANSISTOR CONTROL CIRCUIT

BACKGROUND OF THE INVENTION

In controlling the current flow to high power devices, transistors have been used typically in one of two modes. One approach is to use a transistor in a switching mode and employ a large inductor to smooth the flow of current. If the frequency of the switching circuit is fixed, then the average current may be controlled by adjusting the period of time the transistor is conducting. In this mode, the power rating of the transistor is usually limited by its breakdown voltage and switching time. In another mode, transistors may be operating in a linear mode with a plurality of transistors connected in parallel and provided with cooling means. The power rating of the transistor is a function of voltage and current, however the power rating may be reduced as the voltage is increased due to a characteristic known as secondary breakdown. If the critical voltage at any given current level is exceeded, then the transistor is likely to fail.

In order to handle large currents from high voltage sources, a plurality of transistor arrays may be connected in series with the hope that the voltage will be distributed in such a way that each transistor will be operated within its limitations. However, such arrangements are difficult to balance, and the failure of one or more transistors within one array may result in a higher voltage being placed across the other arrays in series therewith, causing those transistors to fail because of the above mentioned secondary breakdown characteristics. The most common failure mode for transistors operated in this service is to become short circuited.

In the event of a short circuit of a transistor within one array, the over voltage condition experienced by the other transistors may be so severe that the other transistors will be damaged before a circuit breaker or other conventional type of protection circuit could operate. Ultra sophisticated and complicated protection circuits are available and might be useful, but they would also be expensive.

In recent years, development of electric vehicles has resulted in the employment of battery arrays of higher and higher voltages in order to reduce the current and thereby reduce losses in the wiring and control functions. These batteries ought to be tested under conditions which simulate actual use. By way of example, one battery array may include as many as eighteen batteries which have a nominal six-volt rating. It is understood, however, that a fully charged cell may have a full charge potential of 2.75 volts, and therefore each battery will have a 8.25 volt output, and an entire array, when fully charged, will be 148.50 volts. This voltage is far in excess of the voltage rating of most transistors presently available for operation in the linear mode for charging or discharging batteries at a controlled rate.

SUMMARY OF THE INVENTION

This invention relates to a transistor control circuit which may be used with high voltage devices to control the rate of current therethrough. The only condition is that the high voltage source be capable of being tapped so as to present to the control circuit voltage levels which are less than the critical voltage associated with each transistor.

Several transistors are connected in parallel to form an array and a plurality of transistor arrays are connected in series, with each array being provided with its own control circuit. Each array is also so connected to the high voltage devices that the voltage thereacross is less than the critical transistor voltage.

The control circuit for one transistor array senses the current flowing through the source and compares it against a reference to maintain the current flow at the appropriate level. Other arrays are so connected to the previous circuit that they will also maintain the same current level, and therefore no current under normal operating conditions is drawn through the voltage tap connections.

In the event of a short circuit condition of a transistor in one array, circuit breaker means are provided to disable that portion of the circuit, and preferably the entire circuit. Because of the interconnection or voltage tap, the voltage across any array during each malfunction will be limited, and therefore those arrays are protected against damage since they will not experience voltage levels in excess of their critical voltage.

Accordingly, it is an object of this invention to provide a circuit for controlling current through a high voltage battery including a plurality of series connected transistor arrays, means for sensing the current flow through each of said transistor arrays, means associated with each transistor array and responsive to the current flow therethrough for applying control current to the base electrodes of the transistors within said arrays, and means for providing a connection between the transistor arrays and a tap on the high voltage battery such that the voltage applied to each array is less than the critical voltage of the transistors within the array at the maximum current flow therethrough.

These and other objects and advantages of the invention will be apparent from the following description, the accompanying drawings and the appended claims.

DESCRIPTION OF THE PREFERRED EMBODIMENT

Figure 1:
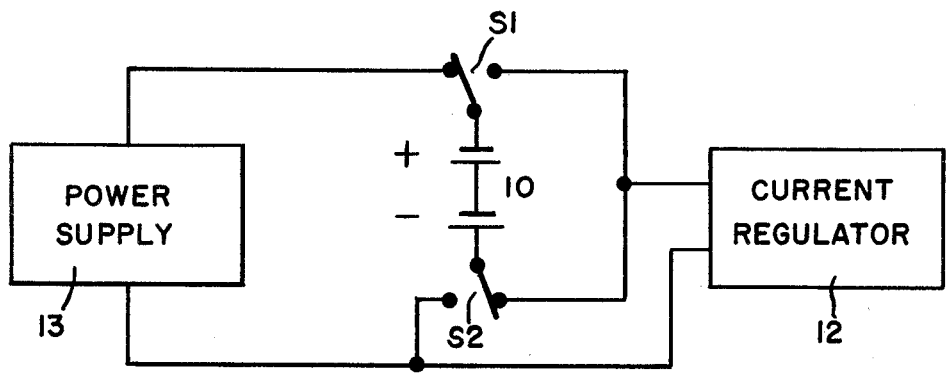
FIG. 1 is a simplified block diagram illustrating the use of a transistor current control circuit in connection with the charging and discharging of a battery.

Referring now to the drawings, and particularly to FIG. 1, battery 10 is connected to a circuit including a current control or regulator device 12 and an unregulated power supply 13. Depending upon the position of the ganged switches S1 and S2, the battery 10 may be either charged or discharged at a controlled rate determined by the current regulator 12.

During charge, the switches S1 and S2 are positioned as shown in FIG. 1 so that the current regulator 12 is in series with the unregulated power supply. In the discharge mode, the position of the switches S1 and S2 will be reversed and the current regulator 12 is connected directly across the battery 10. The heat generated within the current regulator 12 is dissipated by appropriate means, such as by water cooling.

Figure 2:
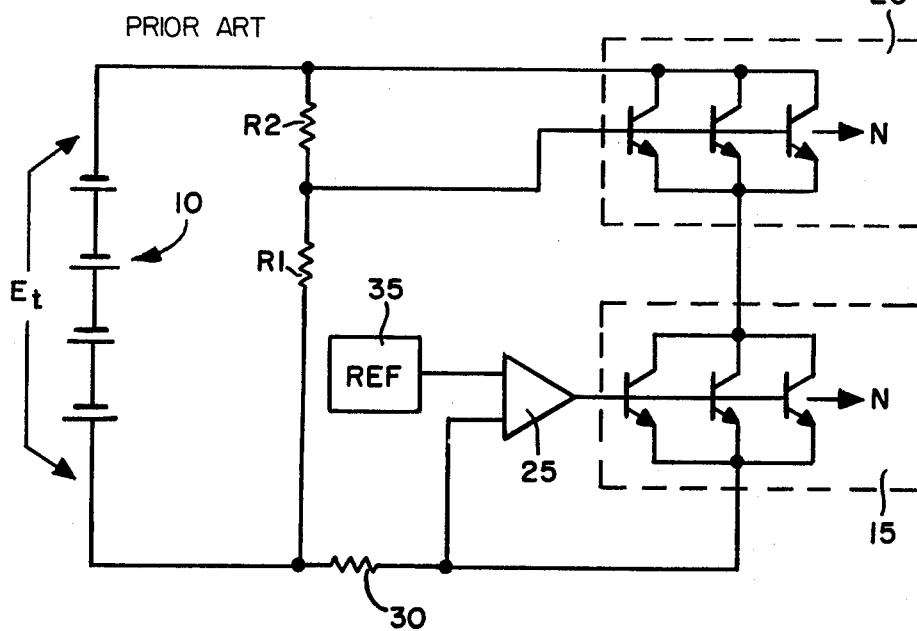
FIG. 2 is a diagram of a typical prior art device.

FIG. 2 illustrates a prior art battery discharger device or current regulator. A high voltage source 10 comprising a plurality of series connected batteries. For example, a power source for electric vehicles may include an array of as many as eighteen batteries each having a nominal six volt rating. When fully charged, however, the voltage output of the source 10 may be as high as 148.50 volts.

The voltage source 10 is connected to a load comprising a first transistor array 15 and a second transistor array 20. Each transistor array includes a plurality of power transistors connected in parallel, with the base electrodes also connected in parallel. The current to the base electrodes controls the effective conductive of the transistors and therefore the current drawn from the voltage source 10.

In FIG. 2, the transistor array 15 is controlled by the output of amplifier 25 having as one input and voltage developed across a shunt 30, and as the other input a reference voltage obtained from a reference source 35. A voltage divider comprising resistors R1 and R2 is used to set the bias for the transistors in array 20.

The total voltage $E_t$ of the high voltage source is divided between the transistor arrays 15 and 20, with the current flow through the transistors being controlled by the setting of the reference 35. Failure of one of the transistors in either array, and failure usually results in a transistor becoming short circuited, will cause the entire voltage $E_t$ to be applied across all of the transistors in the other array.

Figure 5:
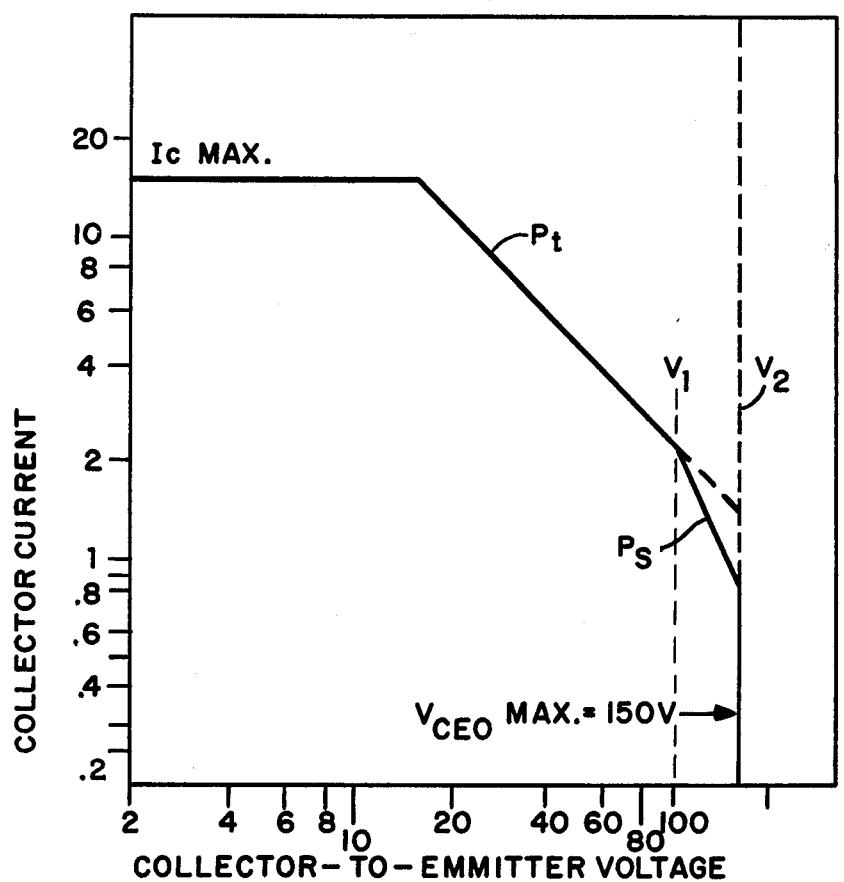
FIG. 5 is a chart of the voltage, current and power limitations of a typical power transistor illustrating its secondary breakdown characteristics.

Referring briefly to FIG. 5, which is a chart illustrating the voltage, current and power limitations of a typical power transistor of the type which may be used for this service, it may be seen that there is a maximum current $I_c$ and a maximum voltage $V_2$ at which the transistor may operate. The transistor also has a maximum power dissipation rating which is represented by the line $P_t$.

In this illustration, a 2N6259 high current transistor is represented as having a maximum current $I_c$ of 16 amps, and a maximum power dissipation $P_t$ for direct current operation in the order of 150 watts. This power level is useful only up to 100 volts ($V_1$). A voltage exceeding $V_1$ but less than $V_2$ results in a substantial decrease in power dissipation capacity of the transistor (represented by line $P_s$) due to the secondary breakdown characteristics of the transistor. When the voltage exceeds $V_1$ but does not exceed $V_2$, then the power dissipation capacity decreases as the voltage increases. As shown in FIG. 5, the maximum current $I_c$ permitted at the maximum voltage $V_2$ of 150 volts results in a power dissipation rating of only 90 watts.

Thus, once the critical voltage ($V_1$) of the transistor is exceeded, its capacity is reduced due to secondary breakdown characteristics, and therefore should a short circuit result in a higher voltage being placed suddenly upon a transistor array while operating at a given power level, permanent damage to all of the transistors therein is likely to occur.

Figure 3:
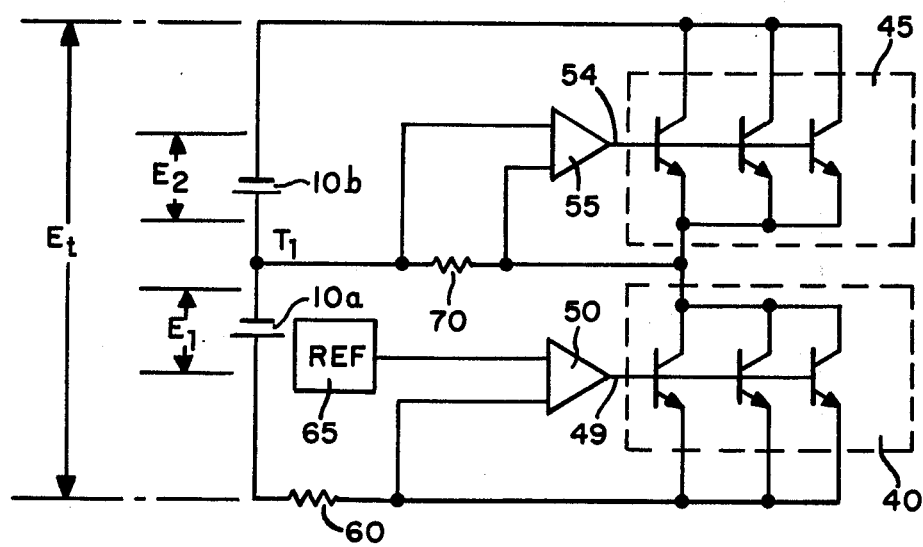
FIG. 3 is a simplified block diagram illustrating the invention.

Referring now to the simplified block diagram showing the invention in FIG. 3, it may be seen that a voltage source 10 capable of being divided by means of a voltage tap $T_1$ into a plurality of series connected sources 10a and 10b, with each source having a voltage $E_1$ and $E_2$, respectively. Neither $E_1$ nor $E_2$ exceeds the critical voltage of the power transistors used in the current control circuit. It is not necessary that these voltages be equal, and it should also be noted that the voltage source 10 could be tapped at more than one point in order to accomplish the purposes of this invention.

The voltage source 10 is connected to a load which comprises a pair of transistor arrays 40 and 45. As in FIG. 2, each transistor array includes a plurality of parallel connected power transistors. The current flowing through transistor array 40 is determined by the current on input line 49 from control amplifier 50, while the current through transistor array 45 is determined by the current on line 54 from control amplifier 55.

Control amplifier 50 is a comparator which has as one input a voltage developed across shunt 60, and as its other input a reference voltage from reference source 65.

Control amplifier 55 is controlled by the current through shunt 70, and this amplifier is designed to cause the current flow through the shunt to approach zero. This is accomplished when the current through transistor array 45 equals the current flow through transistor array 40. It is apparent, that other transistor arrays could be included in series, and similar control circuits provided so that the current drawn from the source 10, and each segment of that source, is controlled by the value of the reference voltage 65.

In the event of a short circuit in one of the transistor arrays, for example array 45, excessive current will begin to be drawn through that array, and this current will initially flow through the shunt 70. Therefore, the initial surge of current will be limited to that portion 10b of the source 10. A circuit breaker may be installed between the source 10 and the array 45 to protect the array and the battery in the event of such a failure. It is noted, however, that the tap $T_1$ on the power source 10 prevents the entire voltage of the source from being applied across the transistors in array 40 under these circumstances and therefore these transistors are protected from damage.

Figure 4:
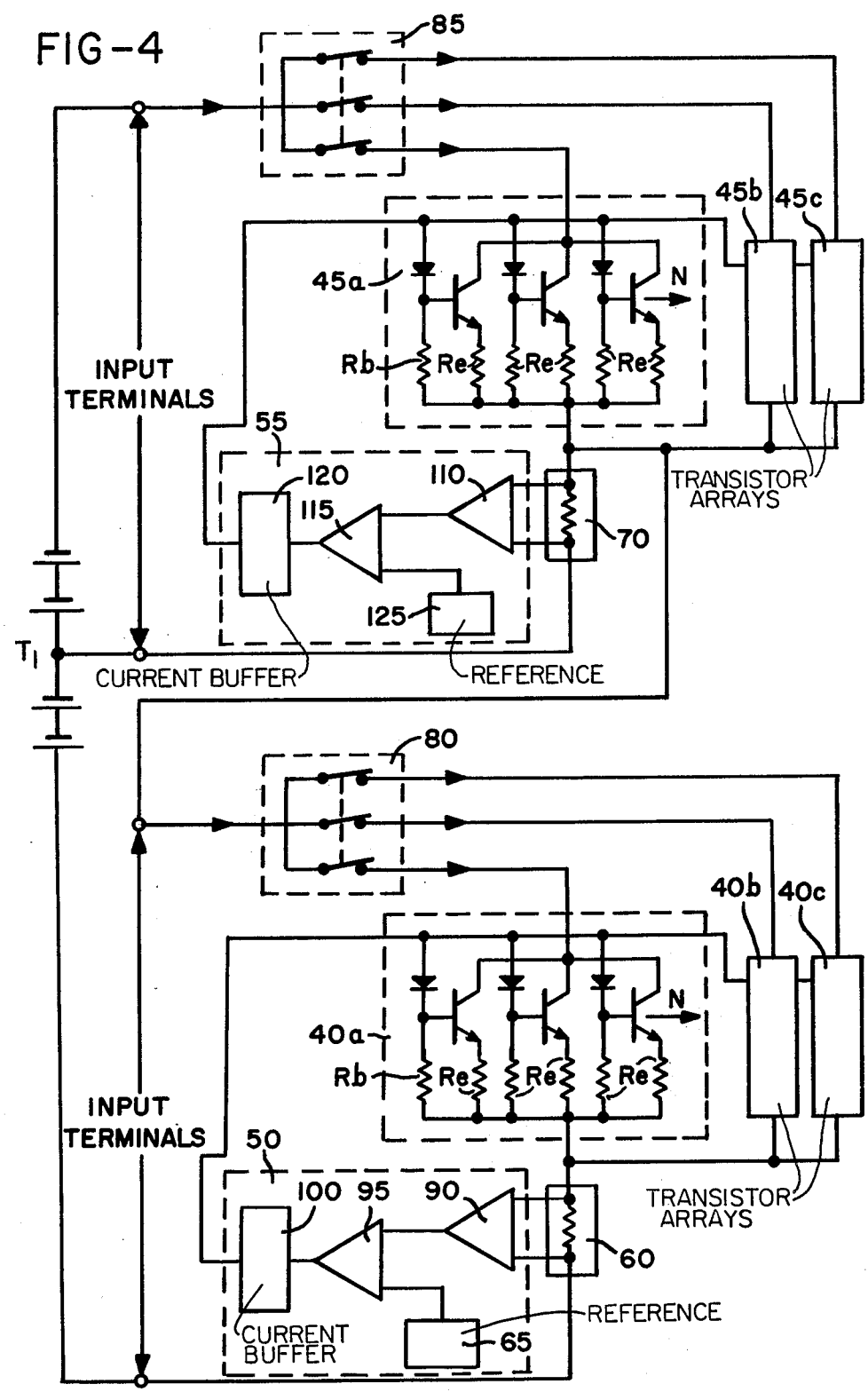
FIG. 4 is a more complete schematic diagram of the invention.

FIG. 4 is a more complete schematic diagram of the circuit shown in FIG. 3. Each of the transistor arrays 40 and 45 may be divided into groups of parallel connected transistors, or sub-arrays 40a, 40b, 40c, 45a, 45b and 45c. Within each group an emitter resistor $R_e$ is provided to balance collector current as the total current is increased, and a diode D is connected between the control line and the base of the transistors to protect against damage in case of a collector-to-base short circuit. Resistor $R_b$ is a base resistor to hold the transistors in a non-conducting state in the absence of a control signal.

Multipole circuit breakers 80 and 85 are connected in series with arrays 40 and 45. The circuit breaker divides the current among the sub-arrays of transistors and insures that there is a reasonably balanced current flow through each. If any sub-array begins to draw a disproportionate amount of current, the circuit breaker will open and remove current to all transistors in that array.

The circuit breakers may be ganged together so that in the event excessive current is drawn by any of the sub-arrays in either circuit, then both circuits will be shut down and thus protected.

The control circuit 50 includes an amplifier 90 connected across the shunt which amplifies the millivolt signal developed as a result of the current flowing through the shunt. The output of the amplifier is connected as one input to the amplifier 95. The other input is from the reference voltage source 65 which may be a precision potentiometer connected to a regulated voltage source. The output of the amplifier 95 is connected to a current buffer 100 having its output connected to the base electrode of the transistors in the array 40.

The control circuit 55 is similarly constructed with voltage amplifier 110, comparator 115, and current buffer converter 120. A reference 125 for the circuit 115 is set to zero.

The invention may be applied to direct current sources such as batteries but it could also apply to alternating current sources which are capable of being tapped at lower voltages by the addition of rectifier means or some other provision so that the nature of the current is consistant with the electrical characteristics of the transistor arrays.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A circuit for controlling current through a high voltage source including
    a plurality of series connected transistor arrays,
    means for sensing the current flow through each of said transistor arrays,
    means associated with each transistor array and responsive to the current flow therethrough for applying control current to the base electrodes of the transistors within said arrays,
    and means for providing a connection between the transistor arrays and a tap on the high voltage source such that the voltage applied to each array is less than the critical voltage of the transistors within the array at the maximum current flow therethrough.

2. A transistorized circuit for controlling the flow of electrical current through a high voltage source capable of being tapped at lower voltages, comprising
    a plurality of series connected transistor arrays,
    means for providing a connection between each of said arrays and a tap on the voltage source such that the maximum voltage across each array is less than the critical voltage of the transistors within said array,
    means for sensing the current through said voltage source and for providing a control signal to one of said arrays to control the current therethrough, and
    means sensing the current flow through said connection means for controlling the current through the other arrays such that the current in said connection means approaches zero thereby causing the current flow through each array to be essentially equal.

3. The transistorized circuit of claim 2 further including circuit breaker means connected in series with each of said arrays.

4. A transistorized circuit for controlling the flow of electrical current through a high voltage battery capable of being tapped at lower voltages, comprising
    a pair of series connected transistor arrays, each provided with a plurality of parallel connected transistors,
    means for providing a connection between said arrays and a tap on the battery such that the maximum voltage across each array is less than the critical voltage of the transistors within said array,
    means for sensing the current through the battery and for providing a control signal to the transistors in one of said arrays to control the current therethrough, and
    means sensing the current flow through said connection means for controlling the current through the transistors in the other array such that the current in said connection means approaches zero thereby causing the current flow through each array to be essentially equal.

* * * * *